(12) United States Patent
Tseng et al.

(10) Patent No.: US 11,756,620 B2
(45) Date of Patent: Sep. 12, 2023

(54) CONTENT-ADDRESSABLE MEMORY AND ANALOG CONTENT-ADDRESSABLE MEMORY DEVICE

(71) Applicant: MACRONIX INTERNATIONAL CO., LTD., Hsinchu (TW)

(72) Inventors: Po-Hao Tseng, Taichung (TW); Feng-Min Lee, Hsinchu (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/463,607

(22) Filed: Sep. 1, 2021

(65) Prior Publication Data
US 2023/0061496 A1    Mar. 2, 2023

(51) Int. Cl.
*G11C 15/00* (2006.01)
*G11C 15/04* (2006.01)

(52) U.S. Cl.
CPC .................. *G11C 15/046* (2013.01)

(58) Field of Classification Search
CPC .................................................... G11C 15/046
USPC ........................................................ 369/49.1
See application file for complete search history.

(56) References Cited

U.S. PATENT DOCUMENTS

| | | | |
|---|---|---|---|
| 6,256,216 B1 | 7/2001 | Lien | |
| 6,317,349 B1 | 11/2001 | Wong | |
| 6,339,540 B1 | 1/2002 | Lavi | |
| 7,177,183 B2 | 2/2007 | Scheuerlein | |
| 8,072,811 B2 * | 12/2011 | Lee | H01L 27/11521 365/185.24 |
| 2009/0190404 A1 | 7/2009 | Roohparvar | |
| 2011/0002167 A1 * | 1/2011 | McCollum | H01L 45/142 365/185.07 |
| 2012/0176841 A1 * | 7/2012 | Lee | G11C 16/10 365/185.17 |
| 2014/0085978 A1 * | 3/2014 | Lee | G11C 15/046 365/185.08 |

* cited by examiner

*Primary Examiner* — Hoai V Ho
(74) *Attorney, Agent, or Firm* — McClure, Qualey & Rodack, LLP

(57) ABSTRACT

A memory cell for an analog content-addressable memory is provided. The memory cell includes an N-type transistor, a P-type transistor, and a current control circuit. The gate of the N-type transistor is configured to receive a first input signal. The gate of the P-type transistor is configured to receive a second input signal. The current control circuit is coupled to at least one of the N-type transistor and the P-type transistor. The current control circuit is configured to generate at least one passing current. When the input voltages of the first input signal and the second input signal are within a matching range, the N-type transistor and the P-type transistor are turned on, and the passing current is substantially a fixed current value. The matching range is related to the threshold voltages of the N-type transistor and the P-type transistor, and the fixed current value.

12 Claims, 10 Drawing Sheets

CONTENT-ADDRESSABLE MEMORY AND ANALOG CONTENT-ADDRESSABLE MEMORY DEVICE

TECHNICAL FIELD

The disclosure relates in general to a memory cell for a content-addressable memory (CAM) and a CAM device, and more particularly to a memory cell for an analog CAM and analog CAM device.

BACKGROUND

With the development of memory technology, a content-addressable memory (CAM) is proposed. CAM is a special memory used for in-memory search in high-speed memory, and can compare the input search words with the stored words in all rows in the array in a highly parallel manner. CAM provides powerful functions in many applications of image (pattern) matching and search.

Compared with the traditional ternary CAM (ternary CAM), the analog CAM significantly increases the data density and reduces the energy consumption of the processing circuit operation and the area of the processing circuit inside the memory. Analog CAM needs to have good memory cell stability and high array density. With the development of big data, a high-density analog CAM is required for data search and data comparison in a huge database. How to avoid the misjudgment of data comparison when judging whether the search range matches the storage range is one of the directions the industry is committed to.

SUMMARY

The disclosure is directed to a memory cell used for an analog content addressable memory and an analog content addressable memory device, which uses a current control circuit to fix the current levels corresponding to different input signals within the matching range to reduce the misjudgment of data comparison.

According to one embodiment, a memory cell for an analog content-addressable memory (analog CAM) is provided. The memory cell includes an N-type transistor, a P-type transistor, and a current control circuit. The N-type transistor has a first gate. The first gate of the N-type transistor is configured to receive a first input signal. The P-type transistor has a second gate. The second gate of the P-type transistor is configured to receive a second input signal. The current control circuit is coupled to at least one of the N-type transistor and the P-type transistor. The current control circuit is configured to generate at least one passing current. When an input voltage of the first input signal and an input voltage of the second input signal are within a matching range, the N-type transistor and the P-type transistor are turned on, and the passing current is substantially a fixed current value. The matching range is related to a threshold voltage of the N-type transistor, a threshold voltage of the P-type transistor, and the fixed current value.

According to another embodiment, an analog CAM device is provided. The analog CAM device includes a word line driving circuit, a number of memory cells, a number of matching signal lines, a number of source lines, a source line driving circuit, and a sense amplifier circuit. The word line driving circuit is configured to provide a number of first input signals and a number of second input signals. Each of the memory cells includes an N-type transistor, a P-type transistor, and a current control circuit. The N-type transistor has a first gate. The first gate of the N-type transistor is configured to receive the corresponding first input signal. The P-type transistor has a second gate. The second gate of the P-type transistor is configured to receive the corresponding second input signal. The current control circuit is coupled to at least one of the N-type transistor and the P-type transistor. The current control circuit is configured to generate a passing current. Each of the matching signal lines is coupled to the corresponding memory cell. Each of the source lines is coupled to the corresponding current control circuit. The source line driving circuit is coupled to the source lines. The sense amplifier circuit is coupled to the matching signal lines. For a particular memory cell among the memory cells, when an input voltage of the first input signal corresponding to the particular memory cell and an input voltage of the second input signal corresponding to the particular memory cell are both within a matching range of the particular memory cell, the N-type transistor and the P-type transistor of the particular memory cell are turned on, and the passing current of the particular memory cell is substantially a fixed current value. The matching range of the particular memory cell is related to a threshold voltage of the N-type transistor of the particular memory cell, a threshold voltage of the P-type transistor of the particular memory cell, and the fixed current value.

According to another embodiment, an analog CAM device is provided. The analog CAM includes a first word line driving circuit, a second word line driving circuit, a first N-channel NAND string group, a first P-channel NAND string group, a number of first sense amplifier circuits, a number of second sense amplifier circuits, and a number of first AND logic gates. The first word line driving circuit is configured to provide a number of first input signals, and the second word line driving circuit is configured to provide a number of second input signals. The first N-channel NAND string group includes a number of first N-channel NAND strings. Each of the first N-channel NAND strings is configured to receive the first input signals. Each of the first N-channel NAND strings is configured to generate a first current. The first P-channel NAND string group includes a number of first P-channel NAND strings. Each of the first P-channel NAND strings is configured to receive the second input signals. Each of the first P-channel NAND strings is configured to generate a second current. The first sense amplifier circuits are respectively coupled to the first N-channel NAND strings of the first N-channel NAND string group. The second sense amplifier circuits are respectively coupled to the first P-channel NAND strings of the first P-channel NAND string group. Each of the first sense amplifier circuits and the second sense amplifier circuits has a threshold current value. Each of the first AND logic gates is coupled to the corresponding first sense amplifier circuit and the corresponding second sense amplifier circuit. One of the first AND logic gates is a selected first AND logic gate. When the first current and the second current corresponding to the selected first AND logic gate both are equal to or larger than the threshold current value, the selected first AND logic gate outputs a first logic value.

Figure 1:
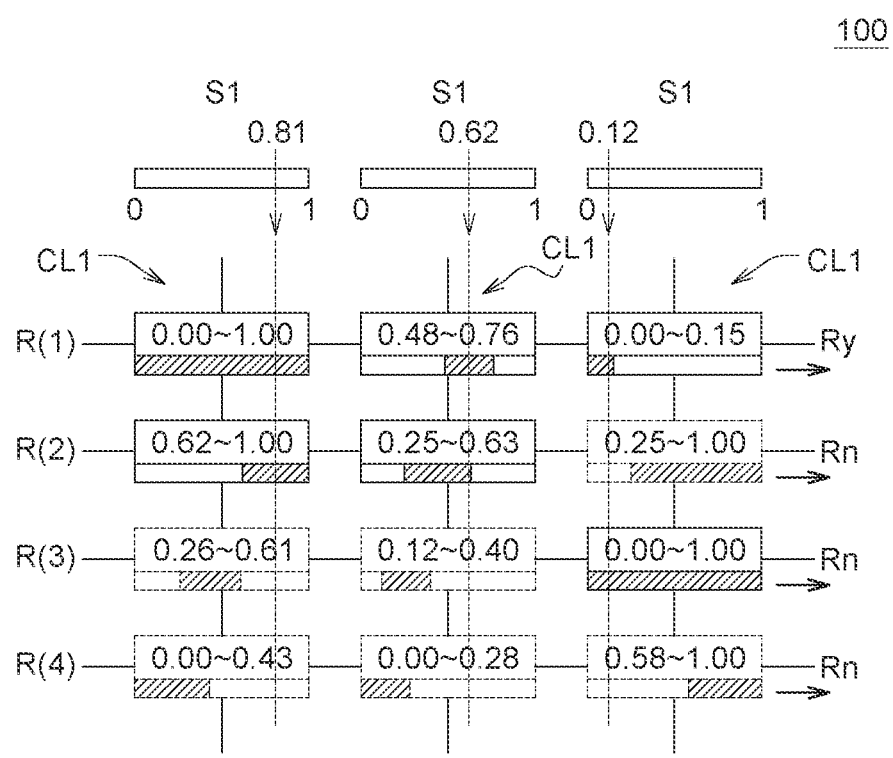
FIG. 1 shows an example of an operation of an analog content-addressable memory (analog CAM)

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Please refer to FIG. 1, which shows an example of an operation of an analog content-addressable memory (analog CAM) 100. The analog CAM 100 includes a number of analog CAM cells CL1. The analog CAM cells CL1 are arranged in several rows R(1), R(2), R(3), R(4) to store a number of words. For example, the word stored in the row R(1) is "0.00-1.00, 0.48-0.76, 0.00-0.15". "0.00-1.00" means any value is matched. The word stored in the row R(2) is "0.62-1.00, 0.25-0.63, 0.25-1.00". The word stored in the row R(3) is "0.26-0.61, 0.12-0.40, 0.00-1.00". The word stored in the row R(4) is "0.00-0.43, 0.00-0.28, 0.58-1.00". A number of inputting signals S1 are inputted to the analog CAM 100. The first inputting signal S1 is "0.81", the second inputting signal S1 is "0.62" and the third inputting signal S1 is "0.12."

The inputting signals S1 are compared with the word stored in the row R(1). "0.00-1.00, 0.48-0.76, 0.00-0.15" of the word stored in the row R(1) are the ranges matched to the inputting signals S1. Because "0.81", "0.62" and "0.12" are respectively within "0.00-1.00", "0.48-0.76" and "0.00-0.15", so the match result Ry is outputted.

The inputting signals S1 are compared with the word stored in the row R(2), and then the mismatch result Rn is outputted. The inputting signals S1 are compared with the word stored in the row R(3), and then the mismatch result Rn is outputted. The inputting signals S1 are compared with the word stored in the row R(4), and then the mismatch result Rn is outputted. That is to say, the analog CAM 100 may store analog data and any of the analog data matched with the inputting signals S1 can be found out.

Figure 2:
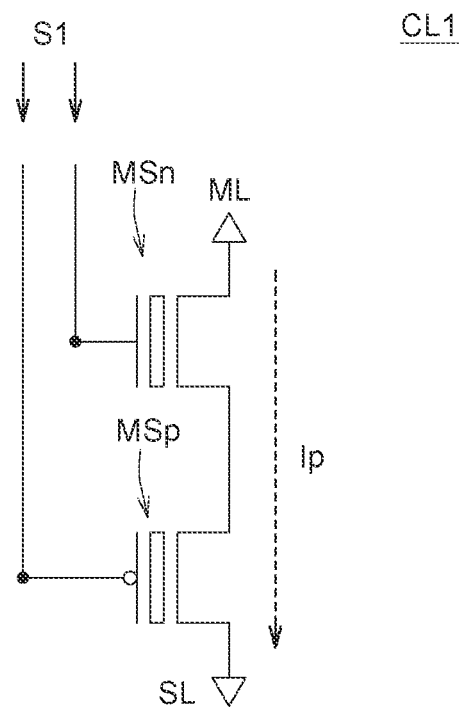
FIG. 2 shows the analog CAM cell CL1.

Please refer to FIG. 2, which shows the analog CAM cell CL1. The analog CAM cell CL1 includes a first floating gate device MSn having an N-type channel and a second floating gate device MSp having a P-type channel. The second floating gate device MSp is connected to the first floating gate device MSn in series. The first floating gate device MSn is a NMOS, and the second floating gate device MSp is a PMOS. A drain of the first floating gate device MSn is connected to a matching signal line ML, a source of the first floating gate device MSn is connected to a source of the second floating gate device MSp. A drain of the second floating gate device MSp is connected to a source line SL. The inputting signal S1 is simultaneously inputted into gates of the first floating gate device MSn and the second floating gate device MSp.

Figure 3:
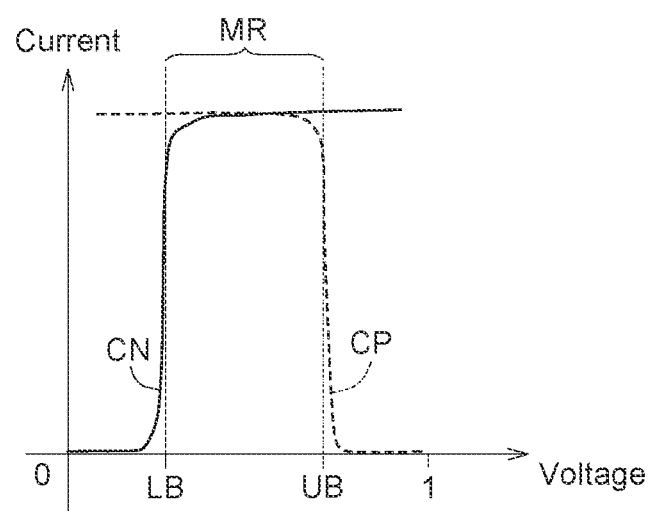
FIG. 3 illustrates a matching range MR of the analog CAM cell CL1.

Refer to FIG. 3, which illustrates a matching range MR of the analog CAM cell CL1. A curve CN is a characteristic curve of the first floating gate device MSn, and a curve CP is a characteristic curve of the second floating gate device MSp. The steep slope of the curve CN and the curve CP are higher than 0.01 mV/dec. For example, the steep slope of the curve CN and the curve CP in FIG. 3 is 0.015 mV/dec. The first floating gate device MSn and the second floating gate device MSp are super steep slope devices.

In the analog CAM cell CL1, a threshold voltage of the first floating gate device MSn is lower than a threshold voltage of the second floating gate device MSp, so the matching range MR is formed between the threshold voltage of the first floating gate device MSn and the threshold voltage of the second floating gate device MSp. In the analog CAM cell CL1, a lower bound LB of the matching range MR is the threshold voltage of the first floating gate device MSn, and an upper bound UB of the matching range MR is the threshold voltage of the second floating gate device MSp.

As shown in FIG. 2 and FIG. 3, when the inputting signal S1 is within the matching range MR, the first floating gate device MSn is turned on and the second floating gate device MSp is turned on. Therefore, a passing current Ip is generated. When the inputting signal S1 is not within the matching range MR, the first floating gate device MSn is turned-off or the second floating gate device MSp is turned-off. Therefore, the passing current Ip is not generated.

Figure 4:
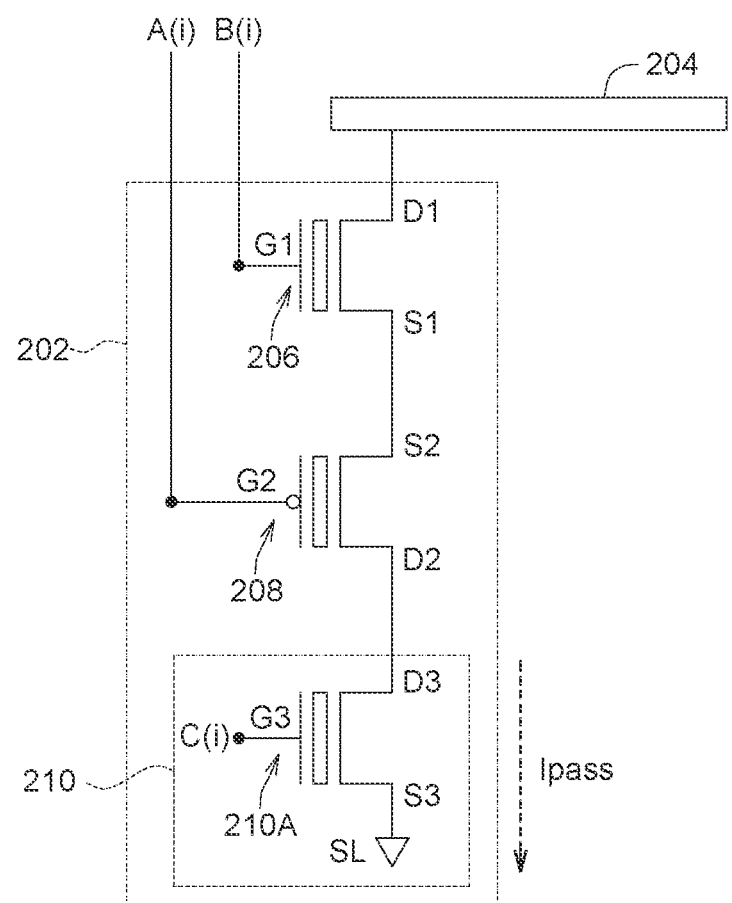
FIG. 4 shows a circuit diagram of the memory cell of an analog CAM according to an embodiment of the present disclosure.

Please refer to FIG. 4, which shows a circuit diagram of the memory cell 202 of an analog CAM 200 according to an embodiment of the present disclosure. The analog CAM 200 includes, for example, a memory cell 202 and a matching signal line 204. The memory cell 202 includes an N-type transistor 206, a P-type transistor 208, and a current control circuit 210. The N-type transistor 206 has a gate G1, and the gate G1 of the N-type transistor 206 is configured to receive a input signal B(i). The P-type transistor 208 has a gate G2, and the gate G2 of the P-type transistor 208 is configured to receive a input signal A(i). The current control circuit 210 is coupled to at least one of the N-type transistor and the P-type transistor, for example, is coupled to the P-type transistor 208. The current control circuit 210 is configured to generate at least one passing current, for example, the passing current Ipass. When an input voltage of the input signal B(i) and an input voltage of the input signal A(i) are within a matching range, the N-type transistor 206 and the P-type transistor 208 are turned on, and the passing current Ipass is substantially a fixed current value. The matching range is related to a threshold voltage of the N-type transistor 206, a threshold voltage of the P-type transistor 208, and the fixed current value.

In this way, by using the current control circuit 210, the magnitude of the current flowing through the N-type transistor 206 and the P-type transistor 208 when the N-type transistor 206 and the P-type transistor 208 are turned on is fixed as the current magnitude of the current control circuit 210. Therefore, even though the input voltage of the input signal A(i) or the input signal B(i) may have several different levels, substantially the same magnitude of current will flow through the N-type transistor 206 and the P-type transistor 208 when the N-type transistor 206 and the P-type transistor 208 are turned on. The currents of the transistors 208 are substantially the same. In this way, even the input voltage of the input signal A(i) or the input signal B(i) may have several different levels, the discharge time on the matching signal line 204 connected to the memory cell 202 can still be the same, so that the matching signal line 204 has a stable discharge time to reduce the possibility of misjudgment.

As shown in FIG. 4, the current control circuit 210 has, for example, a control transistor 210A, which is a metal-oxide-semiconductor field-effect transistor (MOSFET) or a floating gate (FG) transistor. The drain D1 of the N-type transistor 206 is electrically connected to the matching signal line 204. The source S1 of the N-type transistor 206 is electrically connected to the source S2 of the P-type transistor 208. The drain D2 of the P-type transistor 208 is electrically connected to one end of the control transistor 210A (for example, the drain D3 of the control transistor 210A). The control transistor 210A has a gate G3, and the gate G3 of the control transistor 210A is configured to receive a control voltage C(i), and the control voltage C(i) is substantially a fixed voltage value.

The other end of the control transistor 210A (for example, the source S3 of the control transistor 210A) is, for example, electrically connected to a source line SL. In one embodiment, the N-type transistor 206 and the P-type transistor 208 have 2D (two-dimensional) flash memory structure or 3D (three-dimensional) flash memory structure. In one embodiment, F-N tunneling (Fowler-Nordheim tunneling), channel hot electron (CHE) injection, or polysilicon to polysilicon method can be used to preform programming for the N-type transistor 206 and the P-type transistor 208. When performing programming, the input voltage of the input signal A(i) and the input voltage of the input signal B(i) can be different. When performing searching and comparing data, the input voltage of the input signal A(i) and the input voltage of the input signal B(i) are the same. In one embodiment, F-N tunneling, band-to-band hot hole (BTBHH), or polysilicon to polysilicon method can be used to perform erasing for the N-type transistor 206 and the P-type transistor 208.

In one embodiment, the analog CAM 200 is a flash memory. The flash memory is, for example, a charge storage memory, a charge trapping memory, a split gate memory, or a ferroelectric field-effect transistor (FeFET) memory. In another embodiment, the analog CAM 200 is a super steep slope flash memory. Super steep flash memory is thyristor random access memory (TRAM), gate control thyristor (GCT), tunnel field-effect transistor (TFET), or negative capacitance field-effect transistor (NCFET).

Figure 5A:
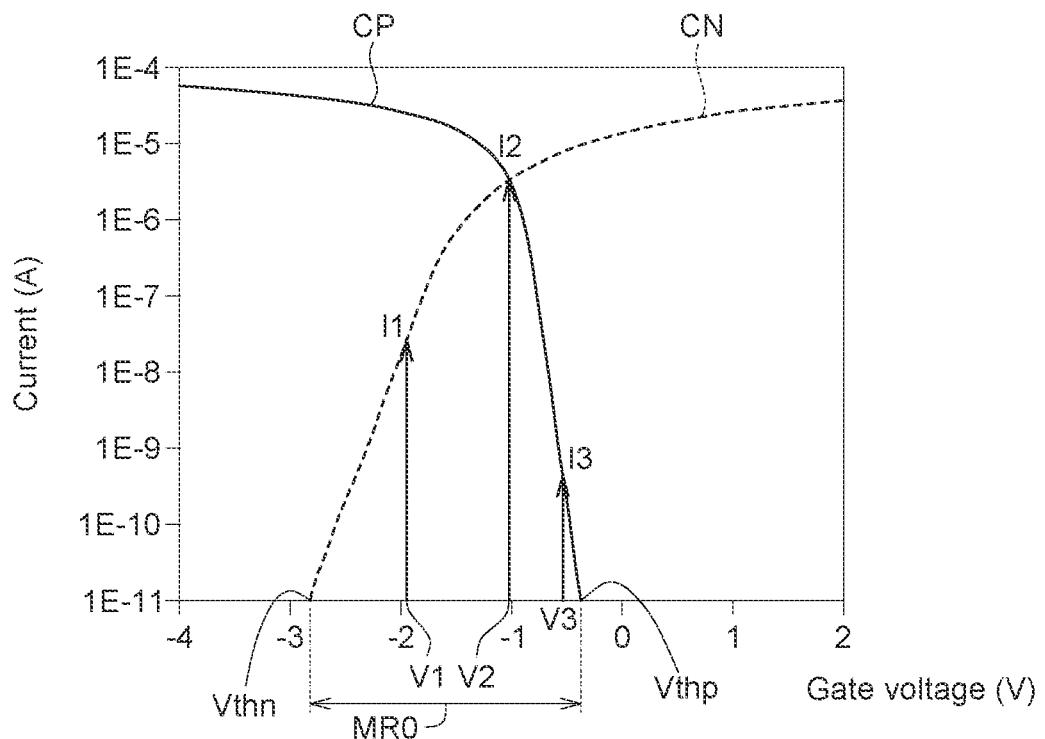
FIG. 5A shows the matching range MR0 of the memory cell without the current control circuit.
Figure 5B:
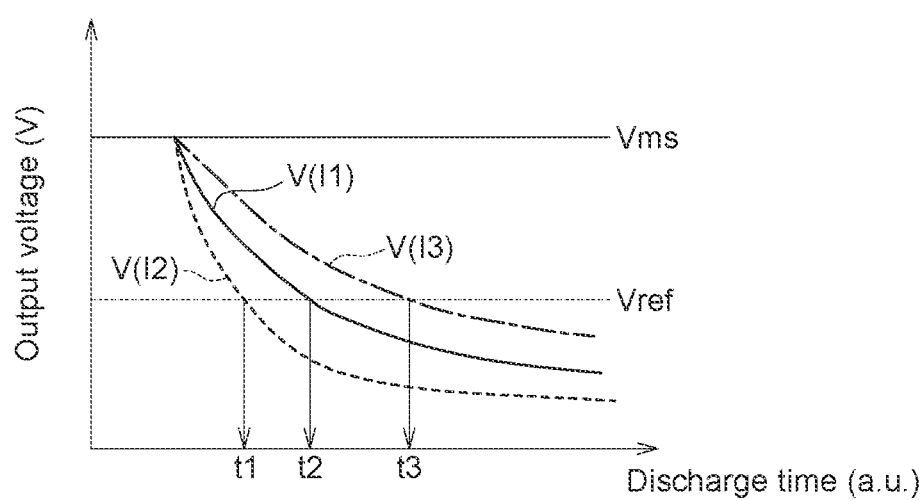
FIG. 5B shows the relationship between the output voltage and the discharge time of the matching signal line connected to the memory cell of FIG. 5A.

Please refer to FIG. 5A and FIG. 5B. FIG. 5A shows the matching range MR0 of the memory cell 202 without the current control circuit 210, and FIG. 5B shows the relationship between the output voltage and the discharge time of the matching signal line 204 connected to the memory cell 202 of FIG. 5A. The curve CN is the characteristic curve of the N-type transistor 206, and the curve CP is the characteristic curve of the P-type transistor 208. The threshold voltage Vthn (for example, about −2.8V) of the N-type transistor 206 and the threshold voltage Vthp (for example, about −0.4V) of the P-type transistor 208 define the matching range MR0. When the N-type transistor 206 and the P-type transistor 208 operate in the subthreshold region, it may occur that the slopes of the curves CN and CP in the matching range MR0 are not steep enough. As shown in FIGS. 5A and 5B, under the situation that the memory cell 202 does not have the current control circuit 210, when the input voltage of the input signals A(i) and B(i) is V1, the N-type transistor 206 is turned on and the current flows through the N-type transistor 206 is I1. The current flows through the P-type transistor 208 is also I1. At this time, the turned-on N-type transistor 206 and P-type transistor 208 will cause the output voltage on the matching signal line 204 to drop from the original voltage Vms according to the curve V(I1), and then drop to the reference voltage Vref for determining whether matching is achieved at time point t2. Similarly, when the input voltage of the input signals A(i) and B(i) is V2, the N-type transistor 206 is turned on and the current flows through the N-type transistor 206 is I2. The turned-on N-type transistor 206 and P-type transistor 208 will cause the output voltage on the matching signal line 204 to drop from the original voltage Vms according to the curve V(I2), and then drop to the reference voltage Vref for determining whether matching is achieved at time point t1. When the input voltage of the input signals A(i) and B(i) is V3, the N-type transistor 206 is turned on and the current flows through the N-type transistor 206 is I3. The turned-on N-type transistor 206 and P-type transistor 208 will cause the output voltage on the matching signal line 204 to drop from the original voltage Vms according to the curve V(I3), and then drop to the reference voltage Vref for determining whether matching is achieved at time point t3. Since the input voltages of different input signals A(i) and B(i) correspond to different currents, the time for the output voltage on the matching signal line 204 to drop from the original voltage Vms to the reference voltage Vref is different. That is to say, for a number of input signals A(i) or B(i) with different voltage levels, the current level when the matching signal line 204 is discharged is not fixed, so that the discharge time on the matching signal line 204 connected to the memory cell 202 is different. That is, the discharge time for the matching signal line 204 is not stable. In this way, when performing data searching and comparing in the memory to determine whether the data range stored in the memory cell and the input data are matched, the length of time required for determination becomes variable, which makes the probability of misjudgment increases.

Figure 6A:
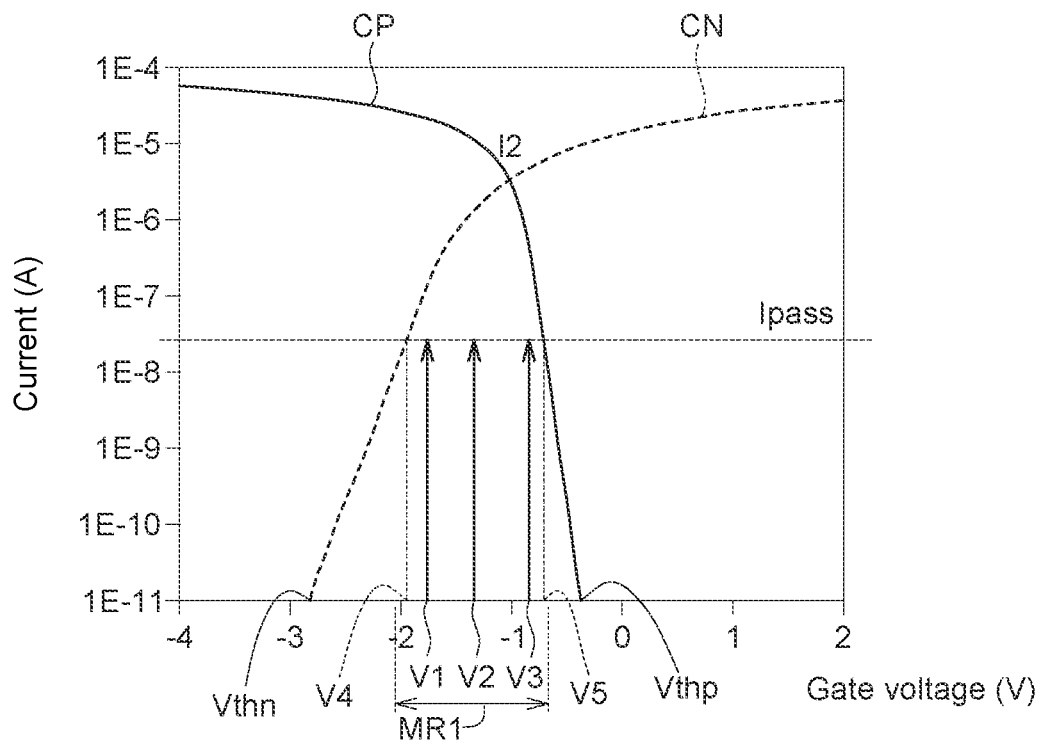
FIG. 6A shows the matching range MR1 of the memory cell with the current control circuit.
Figure 6B:
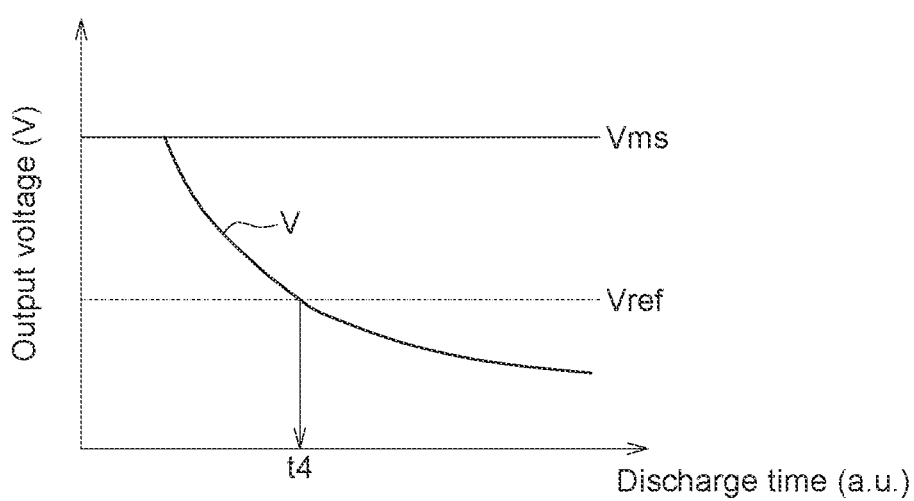
FIG. 6B shows the relationship between the output voltage and the discharge time of the matching signal line connected to the memory cell of FIG. 6A.

Please refer to FIGS. 6A and 6B. FIG. 6A shows the matching range MR1 of the memory cell 202 with the current control circuit 210, and FIG. 6B shows the relationship between the output voltage and the discharge time of the matching signal line 204 connected to the memory cell 202 of FIG. 6A. The curve CN and the curve CP in FIG. 6A are the same as the curve CN and the curve CP in FIG. 5A. The matching range MR1 of the memory cell 202 with the current control circuit 210 is related to the threshold voltage of the N-type transistor 206, the threshold voltage of the P-type transistor 208, and the fixed current value. The matching range MR1 is, for example, defined by the corresponding minimum gate voltage V4 of the N-type transistor 206 (greater than the threshold voltage Vthn of the N-type transistor 206) and the corresponding maximum gate voltage V5 of the P-type transistor 208 (less than the threshold voltage Vthp of the P-type transistor 208) when the N-type transistor 206 and the P-type transistor 208 are both turned on with having the passing current Ipass. As shown in FIG. 6A and FIG. 6B, when the input voltage of the A(i) and the input signal B(i) is V1, the current flows through the N-type transistor 206 is Ipass and the current flows through the P-type transistor 208 is Ipass. At this time, the turned-on N-type transistor 206 and P-type transistor 208 cause the output voltage on the matching signal line 204 to decrease from the original voltage Vms to decrease to the reference voltage Vref for determining whether matching is achieved at time point t4 according to the curve V. Similarly, when the input voltages of the input signals A(i) and B(i) are V2 and V3, the current flows through the N-type transistor 206 is still Ipass, so that the output voltage on the matching signal line 204 still decrease from the original voltage Vms to the reference voltage Vref for determining whether matching is achieved at the time point t4 according to the curve V. Since the input voltages of different input signals A(i) and B(i) will correspond to the same passing current Ipass, the discharge time of the output voltage on the matching signal line 204 from the original voltage Vms to the reference voltage Vref is almost the same. That is, when the memory cell 202 has the current control circuit 210, the current level when the matching signal line 204 is discharged is fixed, so that the discharge time corresponding to the input voltages of different input signals on the matching signal line 204 connected to the memory cell 202 is substantially the same. That is, the discharge time for the matching signal line 204 is stable. In this way, when performing data searching and comparing in the memory to determine whether the data stored in the memory cell and the input data are matched, the length of time required for determining is fixed, which reduces the probability of misjudgment.

Figure 7:
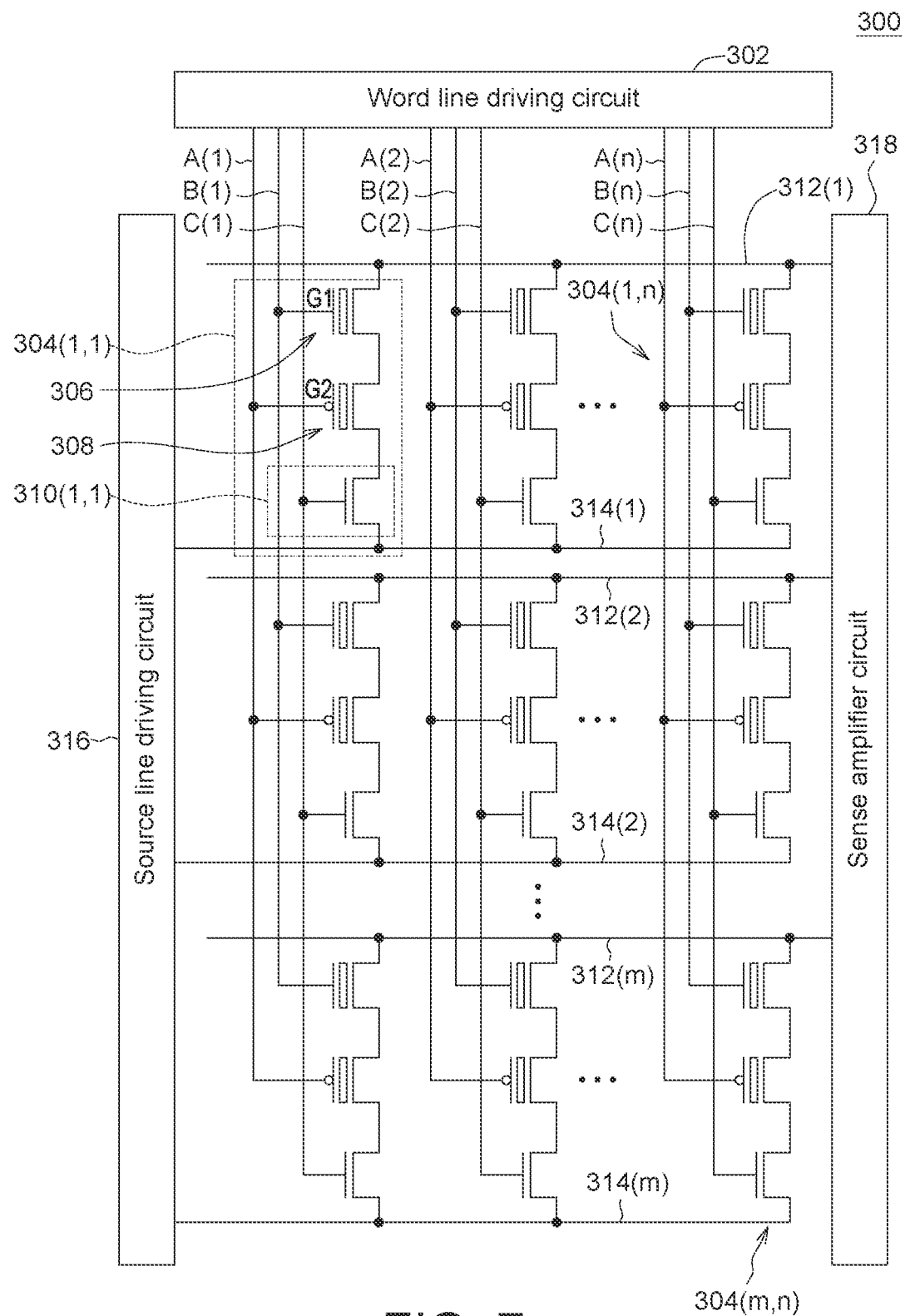
FIG. 7 illustrates an example of applying the memory cell shown in FIG. 4 to an analog CAM device.

Please refer to FIG. 7, which illustrates an example of applying the memory cell shown in FIG. 4 to an analog CAM device 300. The analog CAM device 300 includes a word line driving circuit 302, a number of memory cells 304 (that is, the memory cell 202 in FIG. 4), a number of matching signal lines 312, a number of source lines 314, a source line driving circuit 316, and a sense amplifier circuit 318. The word line driving circuit 302 is configured to provide a number of input signals B(1), B(2), ..., B(n) and a number of input signals A(1), A(2), ..., A(n). Each memory cell 304 of the analog CAM device 300 includes an N-type transistor 306, a P-type transistor 308, and a current control circuit 310. The N-type transistor 306 of each memory cell 304 has a gate G1, and the gate G1 of the N-type transistor 306 of each memory cell 304 is configured to receive the corresponding input signal B(i), and i is a positive integer from 1 to n. The P-type transistor 308 of each memory cell 304 has a gate G2, and the gate G2 of the P-type transistor 308 of each memory cell 304 is configured to receive the corresponding input signal A(i). The current control circuit 310 is coupled to the P-type transistor 308, and the current control circuit 310 is configured to generate the passing current Ipass. Each of the matching signal lines 312 is coupled to the corresponding memory cell 304, and each of the source lines 314 is coupled to the corresponding current control circuit 310. The source line driving circuit 316 is coupled to the source lines 314, and the sense amplifier circuit 318 is coupled to the matching signal lines 312. For a particular memory cell 304($j, i$) among the memory cells (is an integer between 1 and m), when the input voltages of the input signal B(i) corresponding to the particular memory cell 304($j, i$) and the input voltage of the input signals A(i) corresponding to the particular memory cell 304($j, i$) are both within the matching range of the particular memory cell 304($j, i$), the N-type transistor 306 and the P-type transistor 308 of the particular memory cell 304($j, i$) are turned on, and the passing current Ipass of the particular memory cell 304($j, i$) is substantially a fixed current value. The matching range of the particular memory cell 304($j, i$) is related to the threshold voltage of the N-type transistor 306 of the particular memory cell 304($j, i$), the threshold voltage of the P-type transistor 306 of the particular memory cell 304($j, i$), and the fixed current value.

When programming or erasing the memory cells 304 (for example, memory cell 304(1, 1) to memory cell 304($m, n$)), the input signal A(i) and the input signal B(i) can be different. When the input signal A(1) to the input signal A(n) are compared with the content stored in the memory cell 304 in the first row to the m-th row, the input signal A(i) is the same as the input signal B(i).

For example, when the input signal A(1) to the input signal A(n) are compared with the content stored in the memory cells 304(1, 1) to 304($m, n$) respectively in the first row to the m-th row, assuming that the input signal A(1) to the input signal A(n) are within the matching range of the memory cell 304(1, 1) to the memory cell 304(1, $n$) in the first row, it represents that the content of the input signal A(1) to the input signal A(n) matches the stored content of the memory cell 304(1, 1) to the memory cell 304(1, $n$) in the first row. That is, the analog value corresponding to the input signal A(1) to the input signal A(n) is within the analog value range corresponding to the matching range of the memory cell 304(1, 1) to the memory cell 304(1, $n$) in the first row. At this time, the memory cell 304(1, 1) to the memory cell 304(1, $n$) in the first row are all turned on and currents flows through the memory cell 304(1, 1) to the memory cell 304(1, $n$) to pull down the voltage of the matching signal line 312(1) to make the sense amplifier circuit 318 detect the successful match result.

However, when any one of the input signal A(1) to the input signal A(n) is not within the matching range of the corresponding memory cell among the memory cell 304(1, 1) to the memory cell 304(1, $n$) in the first row, it means that the content of the input signal A(1) to the input signal A(n) does not match with the content stored in the memory cell 304(1, 1) to the memory cell 304(1, $n$) in the first row. That is, the analog value corresponding to the input signal A(1) to the input signal A(n) are not completely within the corresponding analog value ranges of the matching range of the memory cell 304(1, 1) to the memory cell 304(1, $n$) in the first row. At this time, at least one of the memory cell 304(1, 1) to the memory cell 304(1, $n$) in the first row will not be turned on, so that the voltage of the matching signal line 312(1) will not be pulled down to be less than the reference voltage Vref. In this way, the sense amplifier circuit 318 will detect the unsuccessful matching result. In other words, the analog CAM 300 can store analog content, any analog content (for example, the analog content stored in the memory cell 304 of a certain row) that matches the input signal A(1) to the input signal A(n) can be searched and found out.

By using the memory cell shown in FIG. 4, the in-memory data searching and comparing can be performed in the analog CAM device 300. When determining whether the data stored in the memory cells and the input data are matched, the voltage of the matching signal line 312 can be reduced with a fixed current value by the turned-on memory cells, and the time of the voltage drop of the matching signal line 312 is controllable to reduce the probability of misjudgment.

Figure 8:
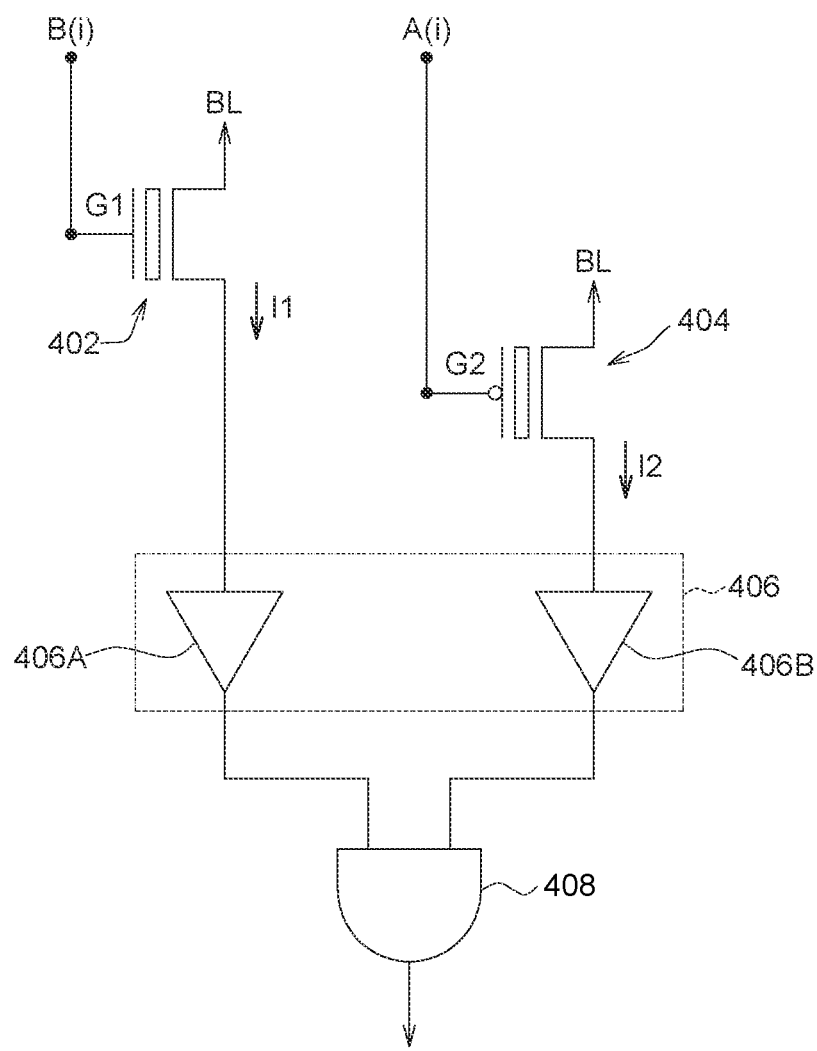
FIG. 8 shows a circuit diagram of a memory cell of an analog CAM according to another embodiment of the present disclosure.

Please refer to FIG. 8, which shows a circuit diagram of a memory cell 400 of an analog CAM according to another embodiment of the present disclosure. The memory cell 400 includes an N-type transistor 402, a P-type transistor 404, a current control circuit 406, and a logic gate 408. The N-type transistor 402 has a gate G1, and the gate G1 of the N-type transistor 402 is configured to receive input signal B(i). The P-type transistor 404 has a gate G2, and the gate G2 of the P-type transistor 404 is configured to receive the input signal A(i). The current control circuit 406 has a first sense amplifier 406A and a second sense amplifier 406B. The AND logic gate 408 is coupled to the first sense amplifier 406A and the second sense amplifier 406B. Each of the first sense amplifier 406A and the second sense amplifier 406B has a threshold current value. The N-type transistor 402 is electrically connected to the first sense amplifier 406A, and the P-type transistor 404 is electrically connected to the second sense amplifier 406B. When the input voltage of the input signal B(i) and the input voltage of the input signal A(i) are within the matching range, one of the at least one passing current I1 corresponding to the N-type transistor 402 and another one of the at least one passing current I2 corresponding to the P-type transistor 404 are both equal to or larger than the threshold current value, and the AND logic gate 408 outputs a first logic value.

Figure 9:
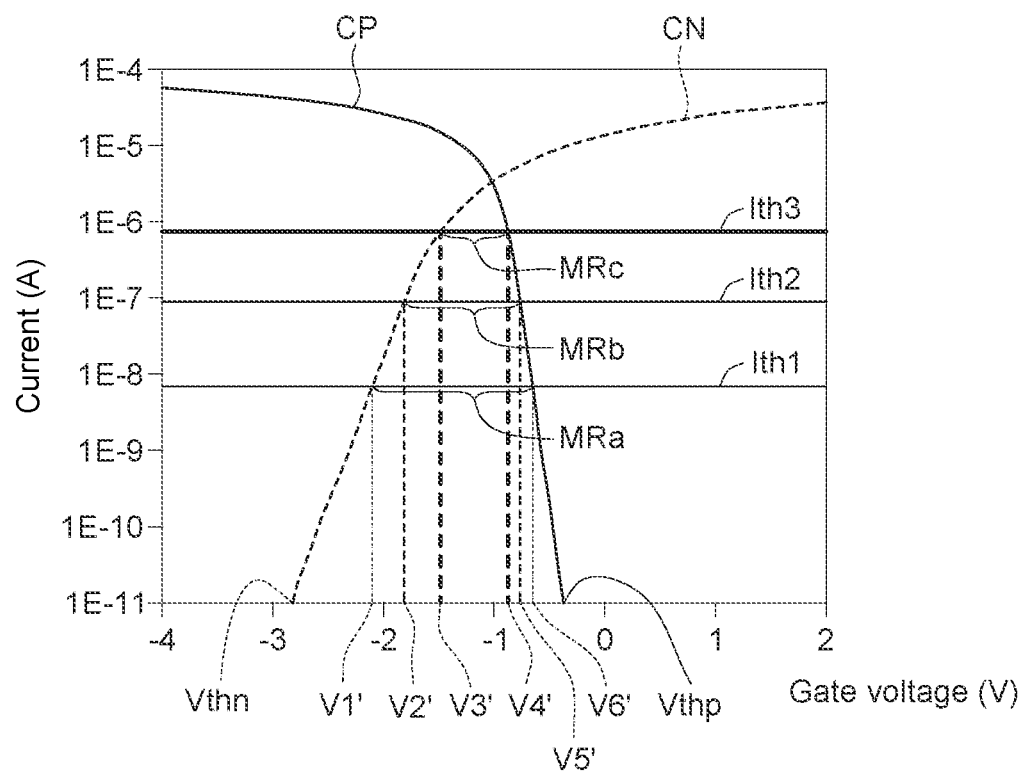
FIG. 9 shows a schematic diagram of the matching range of the memory cell having the current control circuit.

Please refer to FIG. 8 and FIG. 9. FIG. 9 shows a schematic diagram of the matching range of the memory cell 400 having the current control circuit 406. The matching range is related to the threshold voltage Vthn of the N-type transistor 402, the threshold voltage Vthp of the P-type transistor 404, and the threshold current values of the first sense amplifier 406A and the second sense amplifier 406B. As shown in FIG. 9, when the threshold current value of the first sense amplifier 406A and the second sense amplifier 406B is the threshold current value Ith1, the matching range MRa is defined by the gate voltage V1' of the N-type transistor 402 and the gate voltage V6' of the P-type transistor 404. The gate voltage V1' of the N-type transistor 402 is the gate voltage of the N-type transistor 402 when the current flowing through the N-type transistor 402 is the threshold current value Ith1. The gate voltage V6' of the P-type transistor 404 is the gate voltage of the P-type transistor 404 when the current flowing through of the P-type transistor 404 is the threshold current value Ith1. When the threshold current value of the first sense amplifier 406A and the second sense amplifier 406B is the threshold current value Ith2, the matching range MRb is defined by the gate voltage V2' of the N-type transistor 402 and the gate voltage V5' of the P-type transistor 404. The gate voltage V2' of the N-type transistor 402 is the gate voltage of the N-type transistor 402 when the current flowing through the N-type transistor 402 is the threshold current value Ith2. The gate voltage V5' of the P-type transistor 404 is the gate voltage of the P-type transistor 404 when the current flowing through of the P-type transistor 404 is the threshold current value Ith2. When the threshold current value of the first sense amplifier 406A and the second sense amplifier 406B is the threshold current value Ith3, the matching range MRc is defined by the gate voltage V3' of the N-type transistor 402 and the gate voltage V4' of the P-type transistor 404. The gate voltage V3' of the N-type transistor 402 is the gate voltage of the N-type transistor 402 when the current flowing through the N-type transistor 402 is the threshold current value Ith3. The gate voltage V4' of the P-type transistor 404 is the gate voltage of the P-type transistor 404 when the current flowing through of the P-type transistor 404 is the threshold current value Ith3.

Take the threshold current value of the first sense amplifier 406A and the second sense amplifier 406B being the threshold current value Ith1 as an example for description. Please refer to FIG. 8 and FIG. 9. When the input voltage of the input signal A(i) and the input voltage of the input signal B(i) are within the matching range MRa, a first current I1 flows through the N-type transistor 402, and a second current I2 flows through the P-type transistor 404. When the first current I1 and the second current I2 are both equal to or greater than the threshold current value of the first sense amplifier 406A and the second sense amplifier 406B, the first sense amplifier 406A and the second sense amplifier 406B will output the first logic value, for example, the logical value 1. When the input values in the two input ends of the AND logic gate 408 are both the first logic value, the AND logic gate 408 will output the first logic value (for example, logic value 1) to indicate the input voltage of the input signal A(i) and the input voltage of the input signal B(i) is within the matching range MRa.

Therefore, according to the embodiment shown in FIG. 8, when the input signal A(i) and the input signal B(i) are both within the matching range, the same threshold current value for the first sense amplifier 406A and the second sense amplifier 406B is used to determine whether the N-type transistor 402 and the P-type transistor 404 are turned on, so as to reduce the probability of misjudgment.

Figure 10:
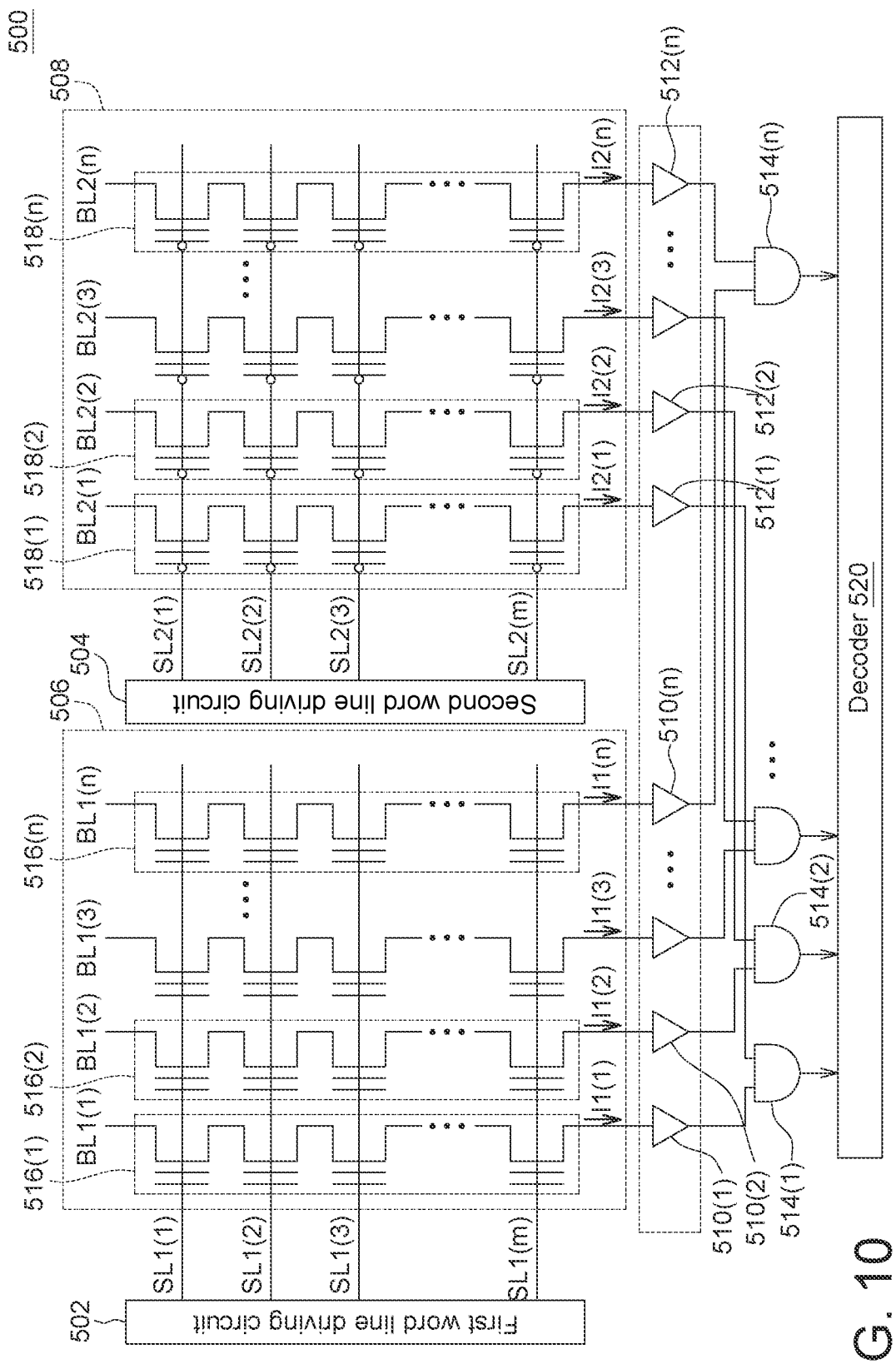
FIG. 10 shows a circuit diagram of an analog CAM device using the memory cell of FIG. 8.

Please refer to FIG. 10, which shows a circuit diagram of an analog CAM device 500 using the memory cell of FIG. 8. The analog CAM device 500 includes a first word line driving circuit 502, a second word line driving circuit 504, a first N-channel NAND string group 506, a first P-channel NAND string group 508, a number of first sense amplifier circuit 510(1), 510(2), . . . , 510(n), a number of second sense amplifier circuits 512(1), 512(2), . . . , 512(n), and a number of first AND logic gates 514(1), 514(2), . . . , 514(n). The first word line driving circuit 502 is configured to provide a number of first input signals SL1(1), SL1(2), . . . , SL1(m), and the second word line driving circuit 504 is configured to provide a number of second input signals SL2(1), SL2(2), . . . , SL2(m). The first N-channel NAND string group 506 includes a number of first N-channel NAND strings 516(1), 516(2), . . . , 516(n), and each of the first N-channel NAND strings 516 is configured to receive the input signals SL1(1), SL1(2), . . . , SL1(m). Each of the first N-channel NAND string 516 is further configured to generate a first current. For example, the first N-channel NAND string 516(1), 516(2), . . . , 516(n) respectively generate the first currents I1(1), I1(2), . . . , I1(n). The first P-channel NAND string group 508 includes a number of first P-channel NAND strings 518(1), 518(2), . . . , 518(n), and each of the first P-channel NAND strings 518 is configured to receive the second input signals SL2(1), SL2(2), . . . , SL2(m). Each of the first P-channel NAND strings 518 is further configured to generate a second current. For example, the first P-channel NAND strings 518(1), 518(2), . . . , 518(n) respectively generate second currents I2(1), I2(2), . . . , I2(n). The first sense amplifier circuits 510(1), 510(2), . . . , 510(n) are respectively coupled to the first N-channel NAND strings 516(1), 516(2), . . . , 516(n) of the first N-channel NAND string group 506. The second sense amplifier circuits 512(1), 512(2), . . . , 512(n) are respectively coupled to the first P-channel NAND strings 518(1), 518(2), . . . , 518(n) of the first P-channel NAND string group 508. Each of the first sense amplifier circuit 510(1), 510(2), . . . , 510(n) and the second sense amplifier circuit 512(1), 512(2), . . . , 512(n) has a threshold current value. Each of the first AND logic gates 514 is coupled to the corresponding first sense amplifier circuit 510 and the corresponding second sense amplifier circuit 512. One of the first AND logic gates 514(1), 514(2), . . . , 514(n) is a selected first AND logic gate 514(i), i is a positive integer from 1 to n. When the first current I1(i) and the second current I2(i) corresponding to the selected first AND logic gate 510(i) both are equal to or greater than the threshold current value, the selected first AND logic gate 514(i) outputs a first logical value to a decoder 520. The decoder 520 will determine that the data provided by the first word line driving circuit 502 matches the data stored in the first N-channel NAND string 516(i), and the data provided by the second word line driving circuit 504 matches the data stored in the first P-channel NAND string 518(i).

Therefore, according to FIG. 9, the first sensing amplifier circuit 510(i) and the second amplifier sensing circuits 512(i) of the analog CAM device 500 can output the first logic value when the first current I1(i) and the second current I2(i) are equal to or greater than the same current level, that is, the threshold current value of the first sensing amplifying circuit 510(i) and the second sensing amplifying circuit 512(i). In this way, the difference in the length of time required to determine whether matching is achieved due to the difference in the magnitude of the first current I1 or the second current I2 can be avoided when searching and comparing for analog data in the memory is performed, so as to reduce the possibility of misjudgment.

Furthermore, as shown in FIG. 10, one end of the first N-channel NAND string 516(i) of the first N-channel NAND string group 506 is configured to receive the first bit line signal BL1(i). Another end of the first N-channel NAND string 516(i) of the first N-channel NAND string group 506 is coupled to the corresponding first sense amplifier circuits 510(i). One end of the first P-channel NAND string 518(i) of the first P-channel NAND string group 508 is configured to receive the second bit line signal BL2(i). Another end of the first P-channel NAND string 518(i) of the first P-channel NAND string group 508 is coupled to the second sense amplifying circuit 512(i). The first N-channel NAND string 516(i) of the first N-channel NAND string group 506 includes a number of first N-type transistors. The first P-channel NAND string 518(i) of the first P-channel NAND string group 508 includes a number of first P-type transistors. Gates of the first N-type transistors of the N-channel NAND string 516(i) are configured to receive the first input signal SL1(1), SL1(2), . . . , SL1(m). Gates of the first P-type transistors of the first P-channel NAND string 518(i) are configured to receive the second input signal SL2(1), SL2(2), . . . , SL2(m).

Assume the data range stored in one of the first N-channel NAND strings (for example, the first N-channel NAND series 516(i), where i is a positive integer from 1 to n) matches the input signal. When the first input signal SL1(1), SL1(2), . . . , SL1(m) provided by the first word line driving circuit 502 match the stored range of the m memory cells in the first N-channel NAND string 516(i), that is, the voltage levels of the first input signals SL1(1), SL1(2), . . . , SL1(m) are respectively within the matching range of m memory cells of the first N-channel NAND string 516(i), the first N-channel NAND string 516(i) will output the first current I1(i). Similarly, When the second input signal SL2(1), SL2(2), . . . , SL2(m) provided by the second word line driving circuit 504 match the stored range of the m memory cells in the first P-channel NAND string 518(i), that is, the voltage levels of the second input signals SL2(1), SL2(2), . . . , SL2(m) are respectively within the matching range of m memory cells of the first P-channel NAND string 518(i), the first P-channel NAND string 518(i) will output the second current I2(i). At this time, when the current magnitudes of the first current I1(i) and the second current I2(i) are both equal to or greater than the threshold current value, the first AND logic gate 514(i) outputs a first logic value, which represents the data provided by the first word line driving circuit 502 matches the data stored in the first N-channel NAND string 516(i), and the data provided by the second word line driving circuit 504 matches the data stored in the first P-channel NAND string 518(i).

In an embodiment, the first N-channel NAND string group 506 and the first P-channel NAND string group 508 have 2D flash memory structure or 3D flash memory structure. In one embodiment, the first N-channel NAND string group 506 and the first P-channel NAND string group 508 can be programmed by using F-N tunneling, channel, hot electron injection, or polysilicon to polysilicon method. In one embodiment, the first N-channel NAND string group 506 and the first P-channel NAND string group 508 can be erased by using F-N tunneling, band-to-band thermal hole, or polysilicon to polysilicon method.

In one embodiment, the analog CAM device 500 is a flash memory, and the flash memory is a charge storage memory, a charge trapping memory, a separate gate memory, or a FeFET memory. In another embodiment, the analog CAM device 500 is an super steep flash memory, and the super steep flash memory is a TRAM, a GCT, a TFET, or a NCFET.

Figure 11:
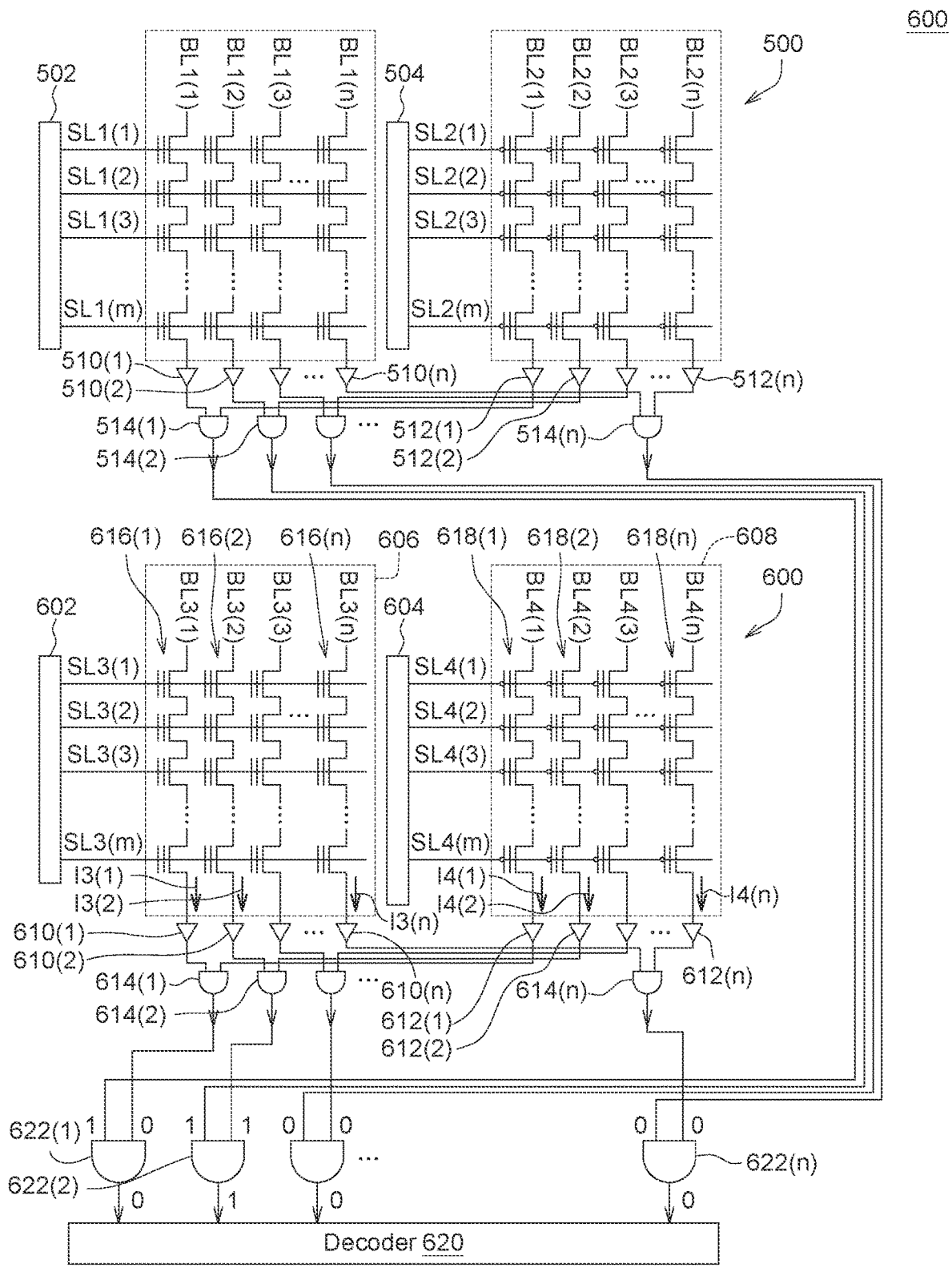
FIG. 11 illustrates an analog CAM device according to another embodiment.

Please refer to FIG. 11, which illustrates an analog CAM device 600 according to another embodiment. The analog CAM device 600 includes the analog CAM device 500 of FIG. 10, a third word line driving circuit 602, a fourth word line driving circuit 604, a second N-channel NAND string group 606, a second P-channel NAND string group 608, a number of third sense amplifier circuits 610(1), 610(2), . . . , 610(n), a number of fourth sense amplifier circuits 612(1), 612(2), . . . , 612(n), a number of second AND logic gates 614(1), 614(2), . . . , 614(n), and a number of third AND logic gates 622(1), 622(2), . . . , 622(n). The third word line driving circuit 602 is configured to provide a number of third input signals SL3(1), SL3(2), . . . , SL3(m), and the fourth word line driving circuit 604 is configured to provide a number of fourth input signals SL4(1), SL4(2), . . . , SL4(m). The second N-channel NAND string group 606 includes a number of second N-channel NAND strings 616(1), 616(2), . . . , 616(n). Each of the second N-channel NAND strings is configured to receive the third input signals SL3(1), SL3(2), . . . , SL3(m). Each of the second N-channel NAND string is further configured to generate a third current. For example, the second N-channel NAND string 616(1), 616(2), . . . , 616(n) respectively generates third currents I3(1), I3(2), . . . , I3(n). The second P-channel NAND string group 608 includes a number of second P-channel NAND strings 618(1), 618(2), . . . , 618(n). Each of the second P-channel NAND strings is configured to receive the fourth input signals SL4(1), SL4(2), . . . , SL4(m). Each of the second P-channel NAND strings is configured to generate a fourth current. For example, the second P-channel NAND strings 618(1), 618(2), . . . , 618(n) respectively generate fourth currents I4(1), I4(2), . . . , I4(n). The third sense amplifier circuit 610(1), 610(2), . . . , 610(n) are coupled to the second N-channel NAND strings 616(1), 616(2), . . . , 616(n) of the second N-channel NAND string group 606. The fourth sense amplifier circuits 612(1), 612(2), . . . , 612(n) are coupled to the second P-channel NAND strings 618(1), 618(2), . . . , 618(n) of the second P-channel NAND string group 608. Each of the third sense amplifier circuits 610(1), 610(2), . . . , 610(n) and the fourth sense amplifier circuits 612(1), 612(2), . . . , 612(n) has a threshold current value. Each of the second AND logic gates 614(1), 614(2), . . . , 614(n) is coupled to the corresponding third sense amplifier circuit and the corresponding fourth sense amplifying circuit. Each of the third AND logic gate 622(1), 622(2), ..., 622(n) is coupled to the corresponding first AND logic gate and the corresponding second AND logic gates. One of the second AND logic gates 614(1), 614(2), ..., 614(n) is a selected second AND logic gate 614(i), and i is a positive integer from 1 to n. When the third current I3(i) and the fourth current I4(i) corresponding to the selected second AND logic gate 614(i) are equal to or greater than the threshold current value, the selected second AND logic gate 614(i) outputs the first logical value. One of the third AND logic gate 622(1), 622(2), ..., 622(n) is a selected third AND logic gate 622(i). When the first AND logic gate 514(i) and the second AND logic gate 614(i) corresponding to the selected third AND logic gate 622(i) both output the first logic value, the selected third AND logic gate 622 (i) outputs the first logical value.

As shown in FIG. 11, one end of each of the second N-channel NAND strings 616(1), 616(2), ..., 616(n) of the second N-channel NAND string group 606 is configured to receive a third bit line signal. For example, the N-channel NAND strings 616(1), 616(2), ..., 616(n) receive the third bit line signals BL3(1), BL3(2), ..., BL3(n), respectively. Another end of each of the second N-channel NAND strings 616(1), 616(2), ..., 616(n) of the second N-channel NAND string group 606 is coupled to the corresponding third sense amplifier circuit. For example, the second N-channel NAND strings 616(1), 616(2), ..., 616(n) are coupled to the third sense amplifier circuits 610(1), 610(2), ..., 610(n), respectively. One end of each of the second P-channel NAND strings 618(1), 618(2), ..., 618(n) of the second P-channel NAND string group 608 is configured to receive a fourth bit line signal. For example, the second P-channel NAND strings 618(1), 618(2), ..., 618(n) receive the fourth bit line signal BL4(1), BL4(2), ..., BL4(n), respectively. Another end of each of the second P-channel NAND strings 618(1), 618(2), ..., 618(n) of the second P-channel NAND string group 608 is coupled to the corresponding fourth sense amplifier circuit. For example, the second P-channel NAND strings 618(1), 618(2), ..., 618(n) are coupled to the fourth sense amplifier circuit 612(1), 612(2), ..., 612(n), respectively. Each of the second N-channel NAND strings of the second N-channel NAND string group 606 includes a number of second N-type transistor. Each of the second P-channel NAND strings of the second P-channel NAND string group 608 includes a number of second P-type transistors. The gate of each second N-type transistor of each second N-channel NAND string is configured to receive the corresponding third input signal. The gate of each second P-type transistor of each second P-channel NAND string is configured to receive the corresponding fourth input signal. Therefore, according to the embodiment of FIG. 11, the first sense amplifier circuit 510(1), 510(2), ..., 510(n), the second amplifier sense circuit 512(1), 512(2), ..., 512(n), the third sense amplifier circuit 610(1), 610(2), ..., 610(n), and the fourth sense amplifier circuit 612(1), 612 (2), ..., 612(n) correspond to the first input signal SL1(1), SL1(2), ..., SL1(m), the second input signal SL2(1), SL2(2), ..., SL2(m), the third input signal SL3(1), SL3(2), ..., SL3(m), and the fourth input signal SL4(1), SL4(2), ..., SL4(m). When the third input signal SL3(1), SL3(2), ..., SL3(m) provided by the third word line driving circuit 602 match the stored ranges in the m memory cells in the second N-channel NAND string 616(i), that is, the voltage levels of the third input signals SL3(1), SL3(2), ..., SL3(m) are respectively within the matching range of the m memory cell of the second N-channel NAND string 616(i), the second N-channel NAND string 616(i) will output the third current I3(i).

Similarly, when the fourth input signal SL4(1), SL4(2), ..., SL4(m) provided by the fourth word line driving circuit 604 match the stored range in the m memory cell in the second P-channel NAND string 618(i), that is, the voltage levels of the fourth input signals SL4(1), SL4(2), ..., SL4(m) are respectively within the matching range of the m memory cells in the second P-channel NAND string 618(i), the second P-channel NAND string 618(i) will output the fourth current I4(i). At this time, when the current magnitudes of the third current I3(i) and the fourth current I4(i) are both equal to or greater than the threshold current value, the second logic gate 614(i) outputs a first logic value, which represents that the data provided by the third word line driving circuit 602 matches the data stored in the second N-channel NAND string 616(i), and the data provided by the fourth word line driving circuit 604 matches the data stored in the second P-channel NAND string 618(i).

When the first AND logic gate 514(i) outputs the first logic value and the second AND logic gate 614(i) outputs the first logic value, the third AND logic gate 622(i) will output the first logic value. As shown in FIG. 11, when i=2, the third AND logic gate 622(2) will output the first logic value (for example, logic value "1") to the decoder 620. At this time, the decoder 620 will determine that the data provided by the first word line driving circuit 502 matches the data stored in the first N-channel NAND string 516(i), the data provided by the second word line driving circuit 504 matches the data stored in the first P-channel NAND string 518(i), the data provided by the third word line driving circuit 602 matches the data stored in the second N-channel NAND string 616(i), and the data provided by the fourth word line driving circuit 604 matches the data stored in the second P-channel NAND string 618(i). In this way, through the analog CAM device 600, the amount of data to be searched can be increased (that is, the amount of input signals is increased). For example, the data provided by the third word line driving circuit 602 and the data provided by the fourth word line driving circuit 604 can be added to perform data searching and comparing to improve the efficiency of the analog CAM. Furthermore, the analog CAM device 600 can further reduce the size of the N-channel NAND string and the P-channel NAND string to reduce the RC delay and accelerate the response speed of the analog CAM device.

According to the above-mentioned embodiment, the memory cell of the analog CAM and the analog CAM device use a current control circuit to fix the current levels of different input signals within the matching range, so that the discharge time of the matching signal line is stable to reduce the probability of misjudgment during data searching and comparing, and to speed up the processing speed of the analog CAM device.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory cell for an analog content-addressable memory (analog CAM), comprising:
   an N-type transistor having a first gate, the first gate of the N-type transistor being configured to receive a first input signal;
   a P-type transistor having a second gate, the second gate of the P-type transistor being configured to receive a second input signal; and a current control circuit, coupled to at least one of the N-type transistor and the P-type transistor, the current control circuit being configured to generate at least one passing current;

wherein when an input voltage of the first input signal and an input voltage of the second input signal are within a matching range, the N-type transistor and the P-type transistor are turned on, and the passing current is substantially a fixed current value, the matching range is related to a threshold voltage of the N-type transistor, a threshold voltage of the P-type transistor, and the fixed current value, and the input voltage of the first input signal and the input voltage of the second input signal are the same when performing searching and comparing data in the analog CAM.

2. The memory cell according to claim 1, wherein the current control circuit has a control transistor, and the control transistor is a metal-oxide-semiconductor field-effect transistor (MOSFET) or a float gate (FG) transistor, a first end of the N-type transistor is electrically connected to a first end of the P-type transistor, a second end of the P-type transistor is electrically connected to one end of the control transistor, the control transistor has a third gate, the third gate of the control transistor is configured to receive a control voltage, and the control voltage is substantially a fixed voltage value.

3. The memory cell according to claim 2, wherein a second end of the N-type transistor is electrically connected to a matching signal line, the second end of the N-type transistor is drain, and the first end of the N-type transistor is source.

4. The memory cell according to claim 1, wherein the analog CAM is a flash memory, the flash memory is a charge storage memory, a charge trapping memory, a split gate memory, or a ferroelectric field-effect transistor (FeFET) memory.

5. The memory cell according to claim 1, wherein the analog CAM is a super steep slope flash memory, the super steep slope flash memory is a thyristor random access memory (TRAM), a gate control thyristor (GCT), a tunnel field-effect transistor (TFET), or a negative capacitance field-effect transistor (NCFET).

6. The memory cell according to claim 1, wherein the N-type transistor and the P-type transistor have 2D (two-dimensional) flash memory structure or 3D (three-dimensional) flash memory structure.

7. An analog CAM device, comprising:
a word line driving circuit, configured to provide a plurality of first input signals and a plurality of second input signals;
a plurality of memory cells, each of the memory cells comprising:
an N-type transistor having a first gate, the first gate of the N-type transistor being configured to receive the corresponding first input signal;
a P-type transistor having a second gate, the second gate of the P-type transistor being configured to receive the corresponding second input signal; and
a current control circuit, coupled to at least one of the N-type transistor and the P-type transistor, the current control circuit being configured to generate a passing current;
a plurality of matching signal lines, each of the matching signal lines being coupled to the corresponding memory cell;
a plurality of source lines, each of the source lines being coupled to the corresponding current control circuit;
a source line driving circuit, coupled to the source lines; and
a sense amplifier circuit, coupled to the matching signal lines;
wherein for a particular memory cell among the memory cells, when an input voltage of the first input signal corresponding to the particular memory cell and an input voltage of the second input signal corresponding to the particular memory cell are both within a matching range of the particular memory cell, the N-type transistor and the P-type transistor of the particular memory cell are turned on, and the passing current of the particular memory cell is substantially a fixed current value, the matching range of the particular memory cell is related to a threshold voltage of the N-type transistor of the particular memory cell, a threshold voltage of the P-type transistor of the particular memory cell, and the fixed current value.

8. The analog CAM device according to claim 7, wherein the current control circuit of each of the memory cells has a control transistor, the control transistor is a MOSFET or a FG transistor, a first end of the N-type transistor is electrically connected to a first end of the P-type transistor, a second end of the P-type transistor is electrically connected to one end of the control transistor, the control transistor has a third gate, the third gate of the control transistor is configured to receive a control voltage, and the control voltage is substantially a fixed voltage value.

9. The analog CAM device according to claim 8, wherein a second end of the N-type transistor of each of the memory cells is electrically connected to the corresponding matching signal line, the second end of the N-type transistor is drain, and the first end of the N-type transistor is source.

10. The analog CAM device according to claim 7, wherein the analog CAM device is a flash memory, the flash memory is a charge storage memory, a charge trapping memory, a split gate memory or a FeFET memory.

11. The analog CAM device according to claim 7, wherein the analog CAM device is a super steep slope flash memory, the super steep slope flash memory is a TRAM, a GCT, a TFET, or a NCFET.

12. The analog CAM device according to claim 7, wherein the N-type transistor and the P-type transistor have 2D flash memory structure or 3D flash memory structure.

* * * * *